US008013347B2

(12) United States Patent
Zhang et al.

(10) Patent No.: US 8,013,347 B2
(45) Date of Patent: Sep. 6, 2011

(54) REMOTE CONTROL LIGHTING ASSEMBLY AND USE THEREOF

(75) Inventors: Zhikuan Zhang, New Territories (CN); Ming Lu, Sijhih (TW); Lydia Leung, New Territories (CN); Kelvin Li, New Territories (CN); Enboa Wu, Irvine, CA (US)

(73) Assignee: Hong Kong Applied Science and Technology Research Institute Co., Ltd., New Territories, Hong Kong SAR (CN)

( * ) Notice: Subject to any disclaimer, the term of this patent is extended or adjusted under 35 U.S.C. 154(b) by 1194 days.

(21) Appl. No.: 11/727,714

(22) Filed: Mar. 28, 2007

(65) Prior Publication Data

US 2008/0211369 A1 Sep. 4, 2008

(30) Foreign Application Priority Data

Mar. 2, 2007 (HK) ................................ 07102387.0

(51) Int. Cl.
*H01L 33/00* (2010.01)

(52) U.S. Cl. ............................ 257/88; 257/99; 257/712

(58) Field of Classification Search .................... 257/88, 257/99, 712
See application file for complete search history.

(56) References Cited

U.S. PATENT DOCUMENTS 7,482,632 B2 * 1/2009 Lu et al. ......................... 257/88

* cited by examiner

*Primary Examiner* — Tuyet Thi Vo
(74) *Attorney, Agent, or Firm* — Buchanan Ingersoll & Rooney PC

(57) ABSTRACT

A remote-controllable lighting device comprising a first substrate and an adjacent second substrate maintained in a spaced apart relationship to allow airflow therebetween and at least partly overlapping each other, at least the second substrates carrying thereon at least one emission sources, the first substrate being located towards a proximal end of the device and the second substrate being located towards a distal end of the device; said first substrate being arranged so as to allow light generated by the at least one located second light emission source to pass thereby in a direction defining a primary light emission direction and said first light emission source located so as to emit light in said primary light emission direction; said first and second substrate being in thermal communication so as to allow heat generated by the at least one light emission sources to flow between the substrates so as to provide thermal distribution between the substrates, the first and second substrate being formed of a thermally conductive material suitable for convection of the generated heat therefrom; a signal detector for receiving a wirelessly transmitted control signal from a remote control device; said signal receiver being located proximal of the first substrate in the primary light emission direction; and a controller in communication with said signal detector and the light emission sources and for controlling at least one characteristic of at least one light emission source responsive to said control signal.

36 Claims, 6 Drawing Sheets

REMOTE CONTROL LIGHTING ASSEMBLY AND USE THEREOF

FIELD OF THE INVENTION

The present invention relates to a lighting device, more particularly to a lighting device having wireless remote control.

BACKGROUND OF THE INVENTION

A lighting device, for example a light bulb or assembly, is conventionally controlled by a switch electrically connected to the light device. In recent developments, wireless communication mechanisms such as infrared signals and radio frequency signals have been used for control of the lighting device.

However, most lighting devices using infrared signals for remote control purpose may unavoidably suffer the drawback of less flexibility including the directional nature of the infrared signals. Further, most lighting devices using radio frequency signals may be unnecessarily bulky.

Furthermore, conventional lighting devices may only support remote control activation over a relatively short distance which heavily depends upon the remote control signal. This may not be convenient especially in a network or situation of a relatively large size.

Therefore, it is an object of the present invention to a controllable lighting device and system, which at lease substantially ameliorates at least some of the deficiencies as exhibited by those of the prior art.

SUMMARY OF THE INVENTION

In a first aspect, the present invention provides a remote-controllable lighting device comprising:

a first substrate and an adjacent second substrate maintained in a spaced apart relationship to allow airflow therebetween and at least partly overlapping each other, at least the second substrates carrying thereon at least one emission sources, the first substrate being located towards a proximal end of the device and the second substrate being located towards a distal end of the device;

said first substrate being arranged so as to allow light generated by the at least one located second light emission source to pass thereby in a direction defining a primary light emission direction and said first light emission source located so as to emit light in said primary light emission direction;

said first and second substrate being in thermal communication so as to allow heat generated by the at least one light emission sources to flow between the substrates so as to provide thermal distribution between the substrates, the first and second substrate being formed of a thermally conductive material suitable for convection of the generated heat therefrom;

a signal detector for receiving a wirelessly transmitted control signal from a remote control device; said signal receiver being located proximal of the first substrate in the primary light emission direction; and a controller in communication with said signal detector and the light emission sources and for controlling at least one characteristic of at least one light emission source responsive to said control signal.

Preferably the first and second substrates carrying thereon at least one first and at least one second light emission sources respectively, and said first substrate includes at least one rebate or aperture located so as to allow light generated by the at least one located second light emission source to pass therethrough in the primary light emission direction.

The lighting device preferably further comprises a housing, wherein said housing substantially surrounding the substrates and includes at least one opening to allow emission of light therethrough, and is in thermal communication with the substrates and being formed of a thermally conductive material suitable for convection of the generated heat therefrom. The substrates may be in thermal communication with each other via the housing, or in thermal communication with each other via one or more spacer members, or combination of both.

The signal detector is preferably located in a position with respect to the housing to allow reception of the control signal. Preferably the signal detector is located adjacent or proximal of the aperture of the housing.

The device preferably further comprises a radio frequency receiver and wherein the signal detector is an antenna for detection of electromagnetic radiation. Preferably the antenna is carried by the first substrate, and the receiver may be carried by the first substrate.

The antenna may be carried by a third substrate formed from a thermally conductive material and located proximal of the first substrate and in thermal communication with the first substrate, and the receiver may be carried by the further substrate.

Each of the at least one first and at least one second light emitting sources may have a unique light emitting source address code, wherein the control signal includes at least one identifying address code identifying one of the at least one first and at least one second light emitting sources and one control code such that said one of the at least one first and at least one second light emitting sources is individually selectable by the remote controller for further operation in accordance with the control code.

The light emitting sources are preferably light emitting diodes. Preferably the light emission of at least two light emitting diodes are of different wavelengths to each other such that the colour of the light emission of the lighting device is adjustable in accordance with the control signal.

The lighting device controller preferably controls activation, deactivation, or adjusts the brightness of the first light emitting source in accordance with the control signal.

The device may further comprise a transmitter for transmitting a status signal indicative of a status of the lighting device to the remote controller for display thereon. The transmitter may transmit a further control signal to a further lighting device.

The device may further comprise at least one further substrate formed from a thermally conductive material being located distal of the second substrate and being in thermal communication with the second substrate. The controller may be carried by a first further substrate.

Preferably the device further comprises a housing surrounding the substrates and controller and includes at least one opening to allow emission of light therethrough, wherein the housing is in thermal communication with the substrates and being formed of a thermally conductive material suitable for convection of the generated heat therefrom and the signal detector is located in a position with respect to the housing to allow reception of the control signal; and a pair of electrical contacts external of the housing for connection to an external electrical power supply and for providing power to the light emission sources. External power received from an external power supply preferably provides power to the signal detector and the controller. Preferably the device of sized and configured so as to be received in and powered by an existing standard lighting fixture.

In another aspect, the present invention provides a lighting system comprising a plurality of addressable lighting devices displaced from each other, each lighting device having a unique lighting device address code and each including at least one light emitting source for emission of light;

a receiver for receiving a control signal from a remote controller device;

a transmitter for retransmitting the control signal wirelessly; and a lighting device controller for determining if the lighting device is selected based on the lighting device identifying address code of the control signal;

wherein the controller lighting device controls at least one characteristic of the light emission source of the light emission device in accordance with the control signal upon selection of the respective lighting device; and the controller controls the transmitter to broadcast the received control signal when the lighting device is not selected.

The lighting devices preferably comprise a first substrate and an adjacent second substrate maintained in a spaced apart relationship to allow airflow therebetween and at least partly overlapping each other, the first and second substrates carrying thereon at least one first and at least one second light emission sources respectively, the first substrate being located towards a proximal end of the device and the second substrate being located towards a distal end of the device;

said first substrate including at least one rebate or aperture located so as to allow light generated by the at least one located second light emission source to pass therethrough in a direction defining a primary light emission direction and said first light emission source located so as to emit light in said primary light emission direction;

said first and second substrate being in thermal communication so as to allow heat generated by the light emission sources to flow between the substrates so as to provide thermal distribution between the substrates, the first and second substrate being formed of a thermally conductive material suitable for convection of the generated heat therefrom;

In a further aspect, the present invention provides a lighting device comprising:

a first substrate and an adjacent second substrate maintained in a spaced apart relationship to allow airflow therebetween and at least partly overlapping each other, the first and second substrates carrying thereon at least one first and at least one second light emission sources respectively, the first substrate being located towards a proximal end of the device and the second substrate being located towards a distal end of the device;

said first substrate including at least one rebate or aperture located so as to allow light generated by the at least one located second light emission source to pass therethrough in a direction defining a primary light emission direction and said first light emission source located so as to emit light in said primary light emission direction; and said first and second substrate being in thermal communication so as to allow heat generated by the light emission sources to flow between the substrates so as to provide thermal distribution between the substrates, the first and second substrate being formed of a thermally conductive material suitable for convection of the generated heat therefrom.

The first substrate and second substrate are preferably substantially planar and substantially parallel to each other.

Preferably at least one further substrate located distal to the second substrate and in thermal communication with the further substrate, wherein each further substrate carries thereon a further at least one light emission source and wherein each proximally adjacent substrate includes at least one rebate or aperture located in a position so as to allow light generated from each distally adjacent at least one light source to pass therethrough in a proximal direction.

The first, second and at least one further substrates are preferably substantially parallel to each other and overlapping each other. Preferably the first, second and at least one further substrates are axially aligned and progressively distally smaller in size. The at least a first, second and further light emission sources are preferably progressively located radially inwardly respectively of those of a proximally adjacent substrate. Preferably the substrates are generally circular in shape. The substrates are preferably generally annular in shape. The light emission sources are preferably radially and/or circumferentially offset from those carried by other substrates.

BRIEF DESCRIPTION OF THE DRAWINGS

Preferred embodiments of the present invention will be explained in further detail below by way of examples and with reference to the accompanying drawings, in which.

DETAILED DESCRIPTION OF THE PREFERRED EMBODIMENTS

Figure 1A:
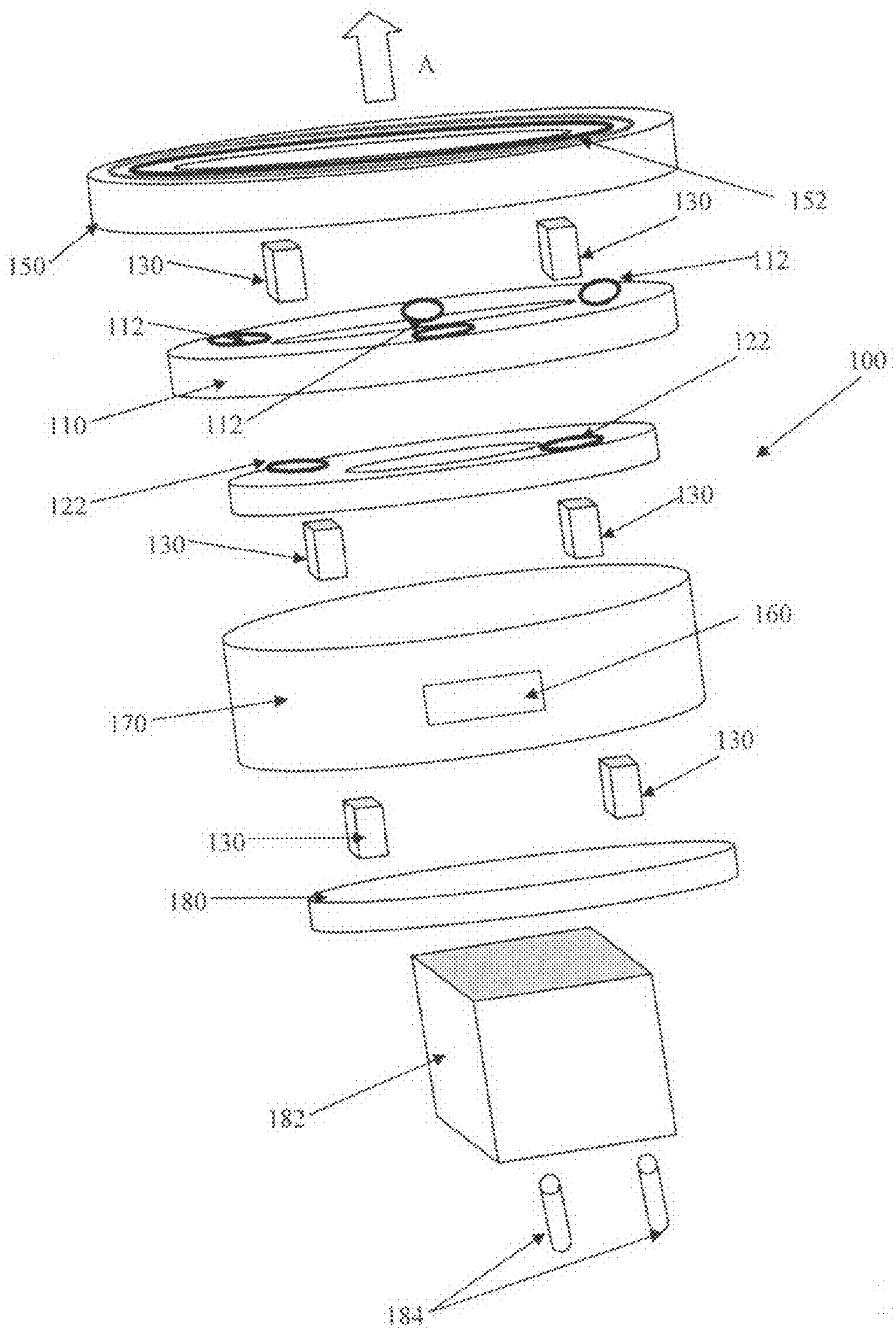
FIG. 1*a* shows a exploded perspective view of an embodiment of a lighting device according to the present invention.
Figure 1B:
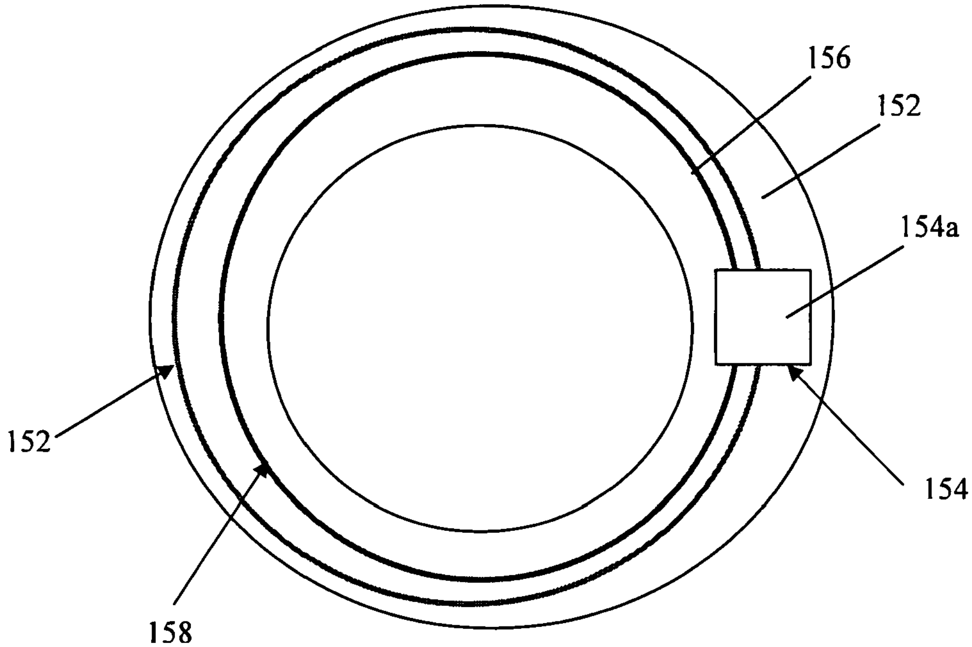
FIG. 1*b* shows a top plain view of an upper antenna layer of the lighting device as depicted in FIG. 1*a;*
Figure 1C:
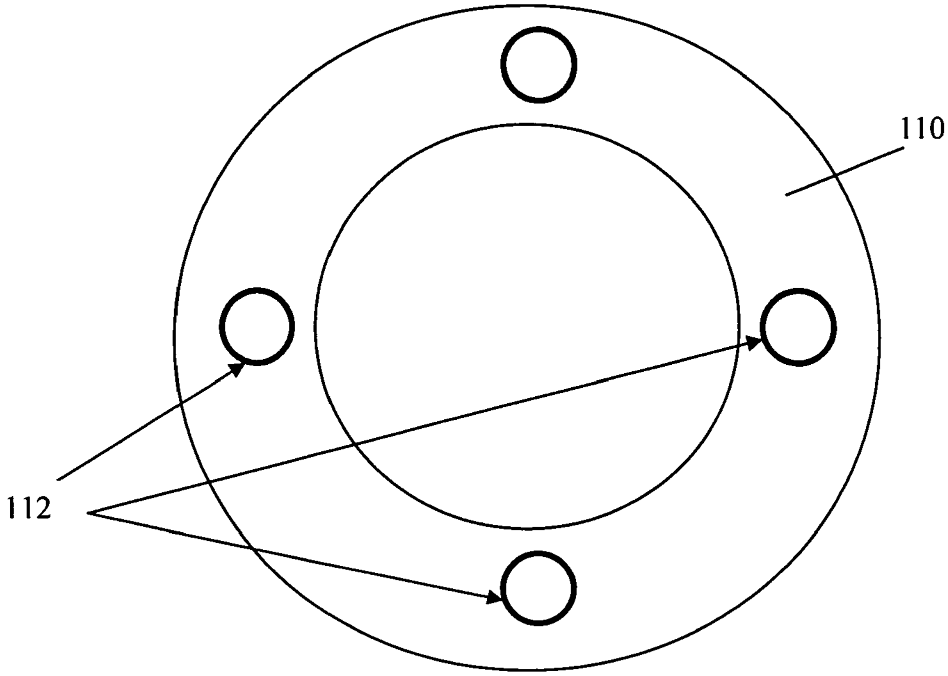
FIG. 1*c* shows a top plain view of light emission layer of the lighting device as depicted in FIG. 1*a;*
Figure 1D:
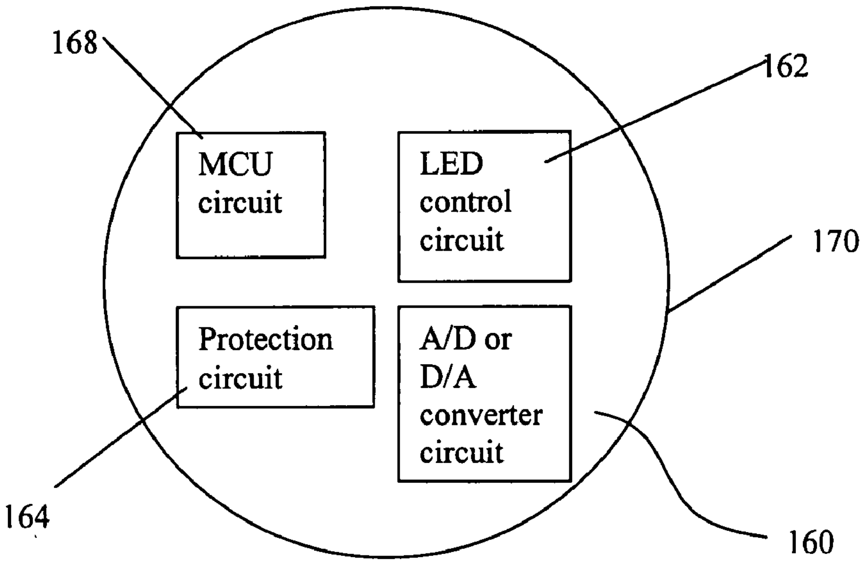
FIG. 1*d* shows a top plain view of an electrical layer of the lighting device as depicted in FIG. 1*a;*

While the present invention has been explained by reference to the examples or preferred embodiments described above, it will be appreciated that those are examples to assist understanding of the present invention and are not meant to be restrictive. Variations or modifications which are obvious or trivial to persons skilled in the art, as well as improvements made thereon, should be considered as equivalents of this invention.

Referring to FIGS. 1*a*, 1*b*, 1*c*, 1*d* and 1*e*, there is shown an exemplary embodiment of a lighting device 100 according to the present invention. The lighting device comprises a first substrate 110 and a second substrate 120. The first substrate 110 carries a plurality of light emission sources, in the present embodiment a plurality of LEDs 112, and the second substrate carries a second plurality of light emission sources, in the present embodiment also a plurality of LEDs 122. The substrates 110, 120 are provided in an overlapping manner and are maintained in a spaced apart relationship by spaced members 130. The second plurality of LEDs 122 are placed in suitable locations and apertures or rebates in the first substrate provided so as to allow the second plurality of LEDs 122 to emit light in a substantially unobstructed manner in a primary light emission direction as depicted by arrow "A".

Figure 1E:
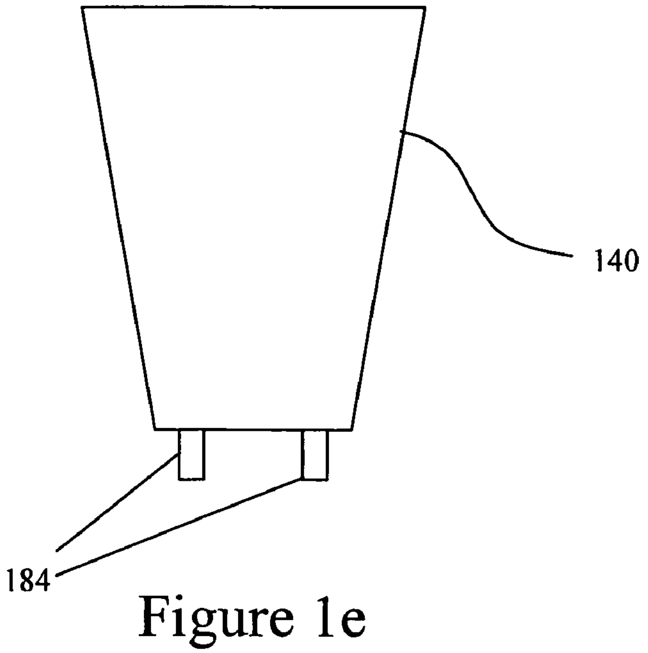
FIG. 1*e* shows a side view of an embodiment of the lighting device according to the present invention.

The spaced members 130 may also provide thermal communication between adjacent substrates. In the present embodiment, a housing member 140 is provided as shown in FIG. 1*e* which houses the components of the device 100 therein. The housing member 140 may alternatively or in addition provide thermal communication between the various substrates of the device, and formations internal of the housing member 140 may also maintain the substrates in the spaced apart relationship.

By providing the substrates 110, 120 in a spaced apart relationship such that air may pass therebetween, and by providing thermal conductivity between the substrates, heat generated by the light sources 112, 122 may be distributed between the substrates 110, 120 and also dissipated therefrom.

Further, the housing 140, by being in thermal communication with the substrates 110, 120, may also act so as to provide dissipation of heat and convection thereof, thus enhancing heat dissipation and reducing regions of high heat intensity at the substrates 110, 120 or LEDs 112, 122, thus providing a more thermally efficient device.

The substrates 110, 120 may be formed from a thermally conductive material such as metal-core printed circuit board (MC-PCB) or ceramic based substrate, for assisting heat distribution in each substrate. The MC-PCBs or ceramic based substrates may be patterned to provide electrical paths (not shown) thereon for powering the LEDs as will generally be understood by those skilled in the art. Alternatively, PCBs may be formed from materials of relatively lower thermal conductivity such as epoxy resin (FR-4, FR-5) and bismaleimide-triaze (BT).

As will be appreciated by those skilled in the art, other substrates may be provided and in thermal communication with lighting substrates 110, 120 for the further dissipation of heat, without carrying thereon their own light sources. Such further substrates may also be in thermal communication with the housing for again enhanced and increased thermal distribution and dissipation. Further, although in the present embodiment both substrates 110, 120 include light emission sources, those skilled in the art will appreciate that in other or alternate embodiments there may be a single substrate having a light emission sources and other substrates provided in thermal communication with that substrate again for increased or enhanced thermal distribution or dissipation.

Further, there may be provided additional substrates having further pluralities of LEDs, an example of which and the advantages thereof are described below with reference to FIGS. 4*a*, 4*b*, 4*c* and 4*d*. Further structural and alternate detail is also provided with reference to FIGS. 4*a*, 4*b*, 4*c* and 4*d*.

The present embodiment further comprises a receiver for receiving a wirelessly transmitted control signal for control of the lighting device. A signal detector is provided, in the form of an antenna 152 carried by a further substrate 150. In the present embodiment, the receiver is adapted to receive radio frequency (RF) signals in an RF band of convenience commercially and practically, depending upon the application. A receiver operating in the band of about 2.4 GHz is applicable to the present invention.

The antenna 152 is located towards the proximal end of the device 100 so be operatively effective. If the antenna was located more distal than provided by the present invention, the housing and more proximally disposed substrates would interfere with the signal and in the case of an RF signal. Further, is other detectors were to be implemented, such as infra red (IR), such detectors would also be disposed in a similar manner as in the present embodiment.

In the present embodiment, the further substrate does not include any light emission sources, however as will be appreciated by those skilled in the art, in other or alternate embodiments there may be further light emission sources provided on that layer.

The receiver circuitry is located on the substrate 150, adjacent antenna 152 for ease of connectivity. However, of course, the receiver circuitry 154 may be located or carried by other substrates, or be integrally formed with other componentry of the device 100.

A controller 160 is provided on a further substrate 170 also in thermal communication with the second substrate 120 for enhanced thermal distribution. However, in alternate embodiments, the further substrate 170 need not be in thermal communication if sufficient heat dissipation is provided by other layers and/or the housing 140. The controller is in communication with the signal detector 152 and is adapted to control the characteristics of the light dependent upon the control signal received. The controller 160, in the present embodiment, includes a LED control circuit 162, a protection circuit 164 and an A/D and/or D/A converter circuit 166 is also be provided for respective purpose of protection of the electrical circuit and power conversion as will be understood by those skilled in the art.

Further provided by the controller 160 is a processor 168 which is electrically connected to the receiver circuitry 154 for receiving the incoming signals received by the receiver antenna 152. In the present embodiment, there is further provided transmitter circuitry 154*a* and a transmitter antenna 158 which may relay a control signal by for passing on the outgoing signals to the receiver circuitry 154 for transmission through the transmitter antenna 158. The processor 168 is also electrically connected to the control circuit 162 such that it is capable of individually controlling each LED or groups of LEDs in accordance with the incoming signals through the control circuit 405 and/or other electrical components such as the regulator circuit provided on the regulator board as will be appreciated in the art.

The device 100 may further includes a sensor (not shown) for ascertaining the operation status of the device, and such status information can be transmitted through the transmitter antenna 105 to an external device for display thereon.

A socket, although not shown in the present drawings, may optionally or alternatively be provided for receiving cables so as to connect the lighting device 100 to an external power source, also not shown. Alternatively, batteries can be used as the power source for the assembly. Furthermore, wires or other electrical connections (not shown) are provided for electrical connections among the various components on the various boards as will be understood in the art.

In the present embodiment, the device 100 is provided as an integrally formed unit which is suitably sized and adapted to be received in an existing or standard lighting fixture or socket. A regulator circuit 182 is provided, which is also located within the housing 40 and carried by yet a further substrate 180, and a pair of electrical contacts 184 are provided for connection to an existing or standard lighting system or socket As will be appreciated by those skilled in the art, by providing a lighting device with increased thermal dissipation whilst providing increased lighting levels as provided by the present invention, allows a device 100 to be formed which is characterised relatively small size whilst maintaining high amounts of light emission, thus being able to provide enhanced light output, Further, such sizing allows the device to be readily implemented in existing lighting networks or applications without compromise of light level. By being able to provide a greater number of LEDs within a given physical constraint due to the increased heat dissipation characteristics, provides such a suitable device. Still further, by virtue of increased thermal dissipation and reduction in size so that the device 100 may be provided as a relatively small modular device, implantation of the receiver and associated componentry is also provided by the present invention.

A skilled person in the art will appreciate that by using radio frequency signals instead of infrared signals, omni-directional remote control of the device can be achieved. Furthermore, by providing a multi-stack of boards inside the device with a plurality of optical and electrical components carried by different boards, a relatively compact design of a remote control device can be achieved. A skilled person in the art will further appreciate that by providing the device with built-in antenna and control components, such a remote-control device may be ready for use once it is installed without the need of further hardware configuration of the external electrical connections.

Figure 2:
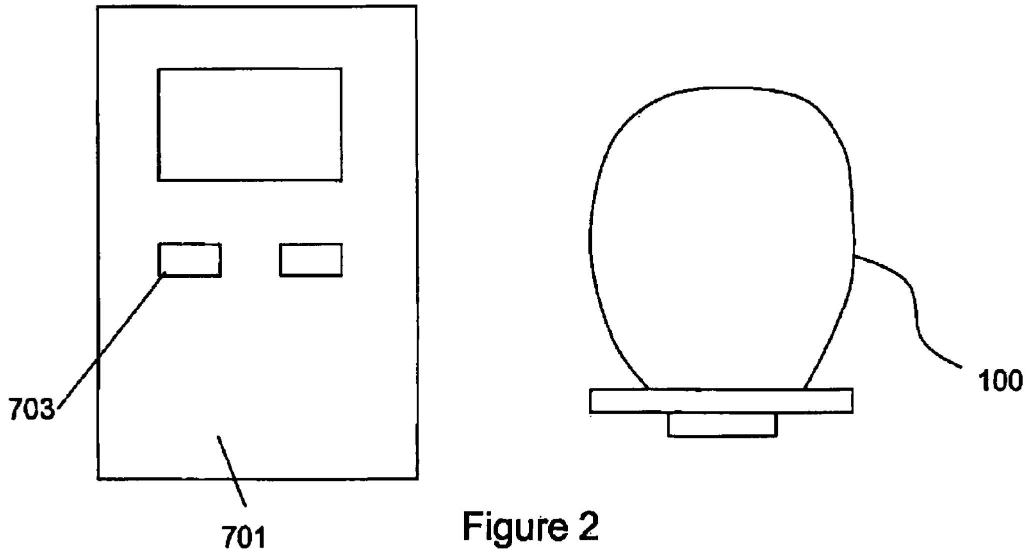
FIG. 2 is a simplified diagram illustrating the operation of lighting device of FIG. 1*a;*

Referring to FIG. 2, in operation, a user can use a remote controller 701 with a plurality of buttons 703 thereon for controlling the remote control device 100 described above. In the exemplary embodiment, the device 100 may have a unique device address code for identifying itself, and each LED may have a unique light emitting source address code as well. The control signal in a radio frequency signal format from the remote controller 701 has at least a device identifying address code, a light emitting source identifying address code and a control code. Upon receipt of the control signal, the controller of the device 100 firstly determines whether the device identifying address code matches its unique device address code. If so, the controller further determines, in accordance with the light emitting source identifying address code, which LED is selected, and further operate to control, for example, turn on, turn off, or adjust the brightness of the selected LED in accordance with the control code. A skilled person will appreciate that multiple LEDS can be collectively selected to be adjusted in one control signal. As such, in a scenario in which LEDs of different colours or wavelengths are provided in the device, the colour of the light emission of the device may be adjustable by adjusting the brightness of the individual LEDs of different colours.

The remote controller may include a display for displaying the status information received from the device 100.

Figure 3:
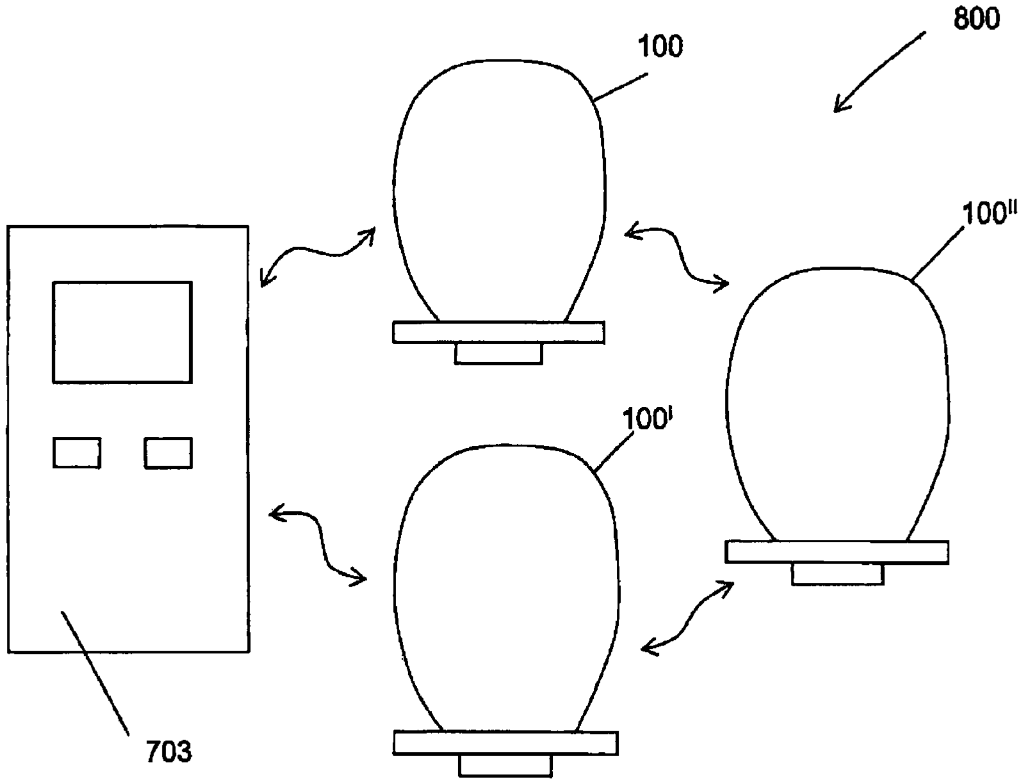
FIG. 3 is a simplified diagram illustrating an exemplary embodiment of a lighting system according to the present invention.

Referring to FIG. 3, an exemplary embodiment of a lighting system 800 according to the present invention is shown. The system 800 includes a remote controller 703 for broadcasting an electromagnetic control signal wirelessly, the control signal including at least a device identifying address code and a control code, and a plurality of addressable devices 100, 100', 100" distanced from each other, each device 100, 100', 100" having a unique device address code and being essentially the same as the exemplary device described above. Due to the distance between the remote controller 700 and the devices, device 100 will firstly receive the control signal from the remote controller and its controller determines whether device 100 is selected or not in view of the device identifying address code of the control signal. If device 100 is selected, its controller accordingly executes the control code for controlling at least one characteristic of the light emitting source in accordance with the control signal. If device 100 is not selected, its controller controls its transmitter to broadcast the received control signal, which will be further received by other devices 100', 100". In this way, the control signal can be transmitted from the remote controller to device 100" over a relatively long distance.

Figure 4C:
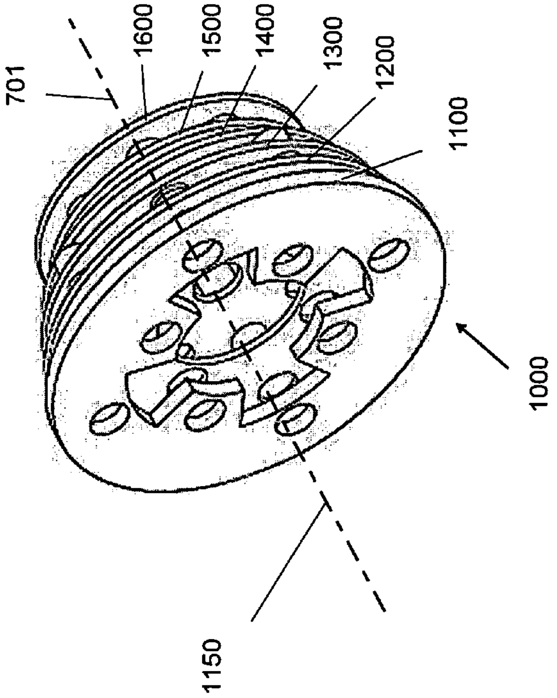
FIG. 4*c* shows a perspective view of the lighting assembly depicted in FIGS. 4*a* and 4*b*.
Figure 4A:
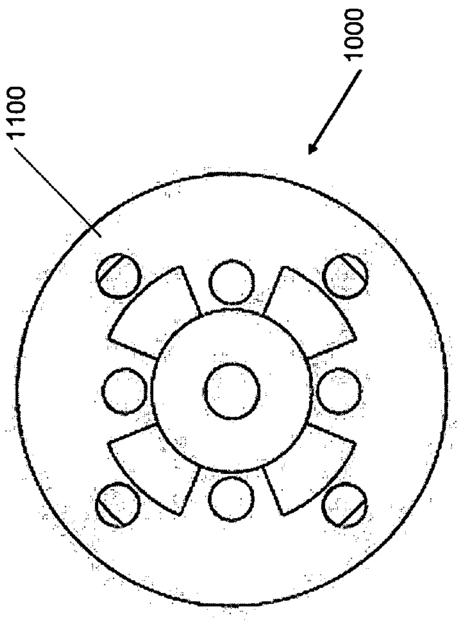
FIG. 4*a* shows a plan view of an embodiment of a lighting assembly according to the present invention.
Figure 4B:
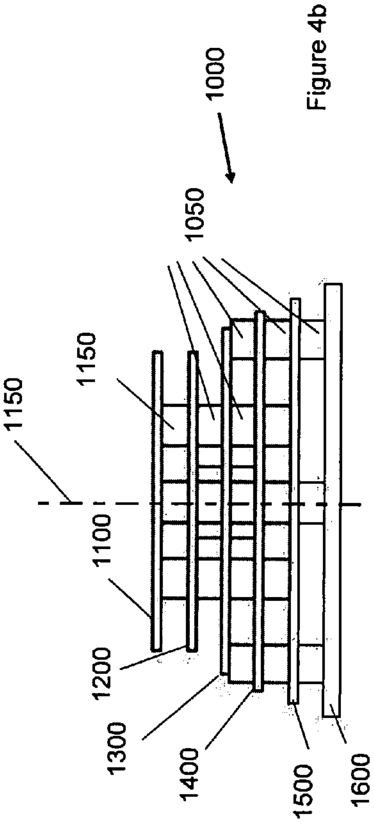
FIG. 4*b* shows a side view of the lighting assembly as depicted in FIG. 4*a;*
Figure 4D:
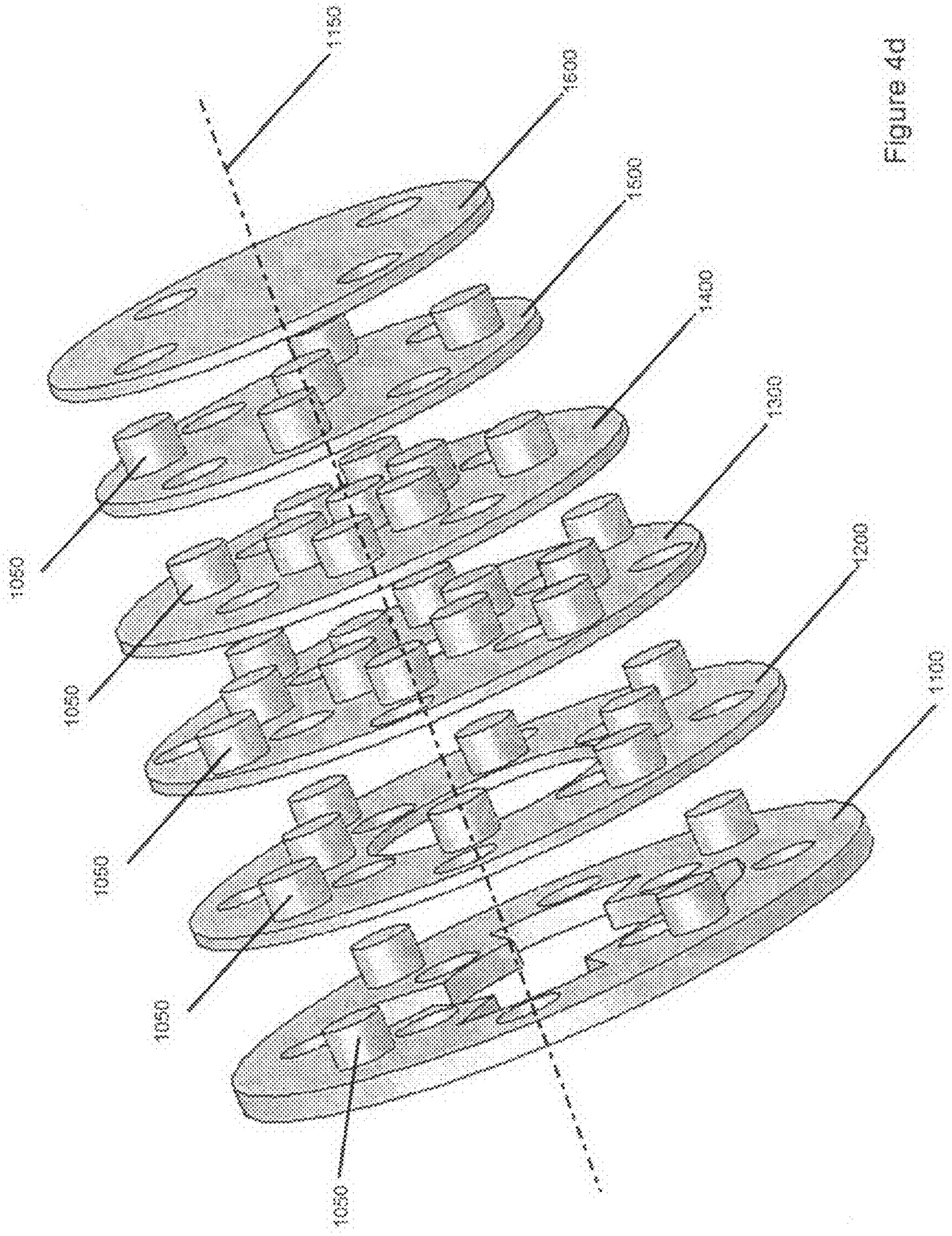
FIG. 4*d* shows an exploded perspective view of a lighting assembly as depicted in FIGS. 4*a* 4*c.*

Referring to FIGS. 4*a*, 4*b*, 4*c* and 4*b*, there is shown an embodiment of a lighting assembly 1000 as provided by the present invention. In the present embodiment, there are provided six substrates, 1100, 1200, 1300, 1400, 1500 and 1600 maintained in a spaced apart relationship by spacer members 1050. Each substrate 1100, 1200, 1300, 1400, 1500 and 1600 is formed from a thermally conductive material such as metal-core printed circuit board (MC-PCB) or ceramic based substrate, and are in thermal communication with each other via the spacer members 1050. The MC-PCBs or ceramic based substrates may be patterned or textured so as to provide electrical paths (not shown) thereon for powering LEDs mounted on the substrates as will be generally understood by those skilled in the art. Alternatively, PCBs may be formed from materials of relatively lower thermal conductivity such as epoxy resin (FR-4, FR-5) and bismaleimide-triaze (BT).

The substrates 1100, 1200, 1300, 1400, 1500 and 1600 are arranged substantially parallel to each other and stacked along an axis 1150 being substantially perpendicular to and passing though centres (not shown) of the layers. In the exemplary embodiment, each substrate has a substantially circular shape, but it will be understood that different shapes will be equally applicable depending upon the required application of the assembly. Further, the substrates are provided so as to be progressively distally smaller in size, from the most proximal substrate 1100 to the most distal substrate 1600 and suitable apertures or rebate are provided such that by providing light emission sources that are progressively located radially inwardly respectively of those of a proximally adjacent substrate, the substrates being generally annular in shape and the light emission sources are radially and/or circumferentially offset from those carried by other substrates, such that light emission in the proximal direction is not obstructed.

As will be appreciated by those skilled in the art, the light emission sources and apertures or rebates are provided in a cooperative matter so as to prevent obstruction of light emitted from light emission sources more distally disposed, and that in other or alternate embodiment, the substrates may be of alternate form and the light emission sources disposed in alternate arrangements so as to prevent obstruction, without departing from the scope of the invention.

By providing the substrates in physically spaced apart relationship to as to allow air flow therebetween, and by providing the substrates as thermally connected, heat generated by light emission sources, for example LEDs, will be transferred from a substrate of a higher temperature to a substrate of a lower temperature, and therefore more even thermal distribution among the substrates can be achieved.

Alternatives may be made to the exemplary embodiments described above. For example, the substrates may be non-parallel to each other; the substrates may be non-planar for example in a concave shape; the substrates may not need to be aligned with each other; some LEDs may be mounted on the lower surface or along a circumference of the substrate(s) with one or more reflectors nearby redirecting the light emissions from these LEDs.

Furthermore, alternate light emitting sources such as cold cathode fluorescent lamps (CCFL) can be used instead of the LEDs.

The present invention, by providing increased thermal dissipation of heat generated by light sources, preferably LEDs, allows more LEDs to be located within an area normal to the primary light emission direction. Thus, more light can be produced more efficiently from a smaller and more compact assembly thus providing increased light efficiency with respect to size, whilst providing a more thermally compliant environment in which the LEDs operate, further providing greater reliability and life expectancy due to lower operating temperatures.

It will be understood that the present embodiment as described and features thereof equally apply to the light emission device as described with reference to FIGS. 1*a*, 1*b*, 1*c*, 1*d*, 2 and 3, and that other substrates in thermal communication with light emission substrates may be provided, for example for additional heat dissipation or for carrying of electronic components. The incorporation of multiple substrates in thermal communication with each other provides for a more thermally and electrically efficient device whilst providing relatively high levels of lighting output.

It will be understood that the invention disclosed and defined herein extends to all alternative combinations of two or more of the individual features mentioned or evident from the text or drawings. All of these different combinations constitute various alternative aspects of the invention. The foregoing describes an embodiment of the present invention and modifications, apparent to those skilled in the art can be made thereto, without departing from the scope of the invention.

Although the invention is illustrated and described herein as embodied, it is nevertheless not intended to be limited to the details described, since various modifications and structural changes may be made therein without departing from the spirit of the invention and within the scope and range of equivalents of the claims.

The invention claimed is:

1. A remote-controllable lighting device, comprising:

a first substrate and an adjacent second substrate maintained in a spaced apart relationship to allow airflow therebetween and arranged in thermal communication to provide thermal distribution between the substrates, at least the second substrates carrying thereon at least one light emission source, the first substrate being located towards a proximal end of the device and the second substrate being located towards a distal end of the device;

a signal transceiver for receiving a first control signal from a remote control device and for transmitting a second control signal said signal transceiver being located proximal of the first substrate; and a controller in communication with said signal transceiver and the light emission sources, said controller being adapted for controlling at least one characteristic of the light emission source responsive to said received first control signal, and, the controller being adapted for generating the second control signal.

2. A lighting device according to claim 1, wherein the first and second substrates carrying thereon at least one first and at least one second light emission sources respectively, and said first substrate includes at least one rebate or aperture located so as to allow light generated by the at least one located second light emission source to pass in a direction defining a primary light emissions direction and said first light emission source located so as to emit light in said primary light emission direction.

3. A lighting device according to claim 1, wherein the substrates are spaced apart and in thermal communication with each other via one or more spacer members.

4. A lighting device according to claim 1, wherein each of the at least one first and at least one second light emitting sources has a unique light emitting source address code, and wherein the first control signal includes at least one identifying address code identifying one of the at least one first and at least one second light emitting sources and one control code such that said one of the at least one first and at least one second light emitting sources is individually selectable by the remote controller for further operation in accordance with the control code.

5. A lighting device of claim 1, wherein the lighting device controller controls activation, deactivation, or adjusts the brightness of the first light emitting source in accordance with the first control signal.

6. A lighting device according to claim 1, wherein the signal transceiver comprises a transmitter for transmitting a status signal indicative of a status of the lighting device to the remote controller for display thereon.

7. A lighting device according to claim 1, wherein the signal transceiver comprises a transmitter for transmitting the second control signal to a further lighting device.

8. A lighting device according to claim 1, wherein the controller is carried by a first further substrate.

9. A lighting device according to claim 1, further comprising a housing, wherein said housing substantially surrounding the substrates and includes at least one opening to allow emission of light therethrough, and is in thermal communication with the substrates and being formed of a thermally conductive material suitable for convection of the generated heat therefrom.

10. A lighting device according to claim 9, wherein the substrates are in thermal communication with each other via the housing.

11. A lighting device according to claim 9, wherein the signal transceiver is located in a position with respect to the housing to allow reception and transmission of the first and second control signals respectively.

12. A lighting device according to claim 9, wherein the signal transceiver is located adjacent or proximal of the aperture of the housing.

13. A lighting device according to claim 1, further comprising at least one further substrate formed from a thermally conductive material being located distal of the second substrate and being in thermal communication with the second substrate, said at least one further substrate providing for thermal dissipation of heat received from other substrates.

14. A lighting device according to claim 13, wherein one or more of the at least one further substrate carries thereon a at least one further light emission source.

15. A light device according to claim 1, further comprising:

a housing surrounding the substrates and controller and comprising at least one opening to allow emission of light therethrough, wherein the housing is in thermal communication with the substrates and being formed of a thermally conductive material suitable for convection of the generated heat therefrom and the signal transceiver is located in a position with respect to the housing to allow reception and transmission of the first and second control signals respectively; and a pair of electrical contacts external of the housing for connection to an external electrical power supply and for providing power to the light emission sources.

16. A lighting device according to claim 15, wherein external power received from an external power supply provides power to the signal transceiver and the controller.

17. A lighting device according to claim 15, wherein the device of sized and configured so as to be received in and powered by an existing standard lighting fixture.

18. A lighting device according to claim 1, wherein the signal transceiver comprises an antenna for detection of electromagnetic radiation and a radio frequency receiver for receiving the first control signal according to the detection of electromagnetic radiation.

19. A lighting device according to claim 18, wherein the antenna is carried by the first substrate.

20. A lighting device according to claim 19, wherein the receiver is carried by the first substrate.

21. A lighting device according to claim 18, wherein the antenna is carried by a third substrate formed from a thermally conductive material and located proximal of the first substrate and in thermal communication with the first substrate.

22. A lighting device according to claim 21, wherein the receiver is carried by the third substrate.

23. A lighting device according to claim 1, wherein the light emitting sources are light emitting diodes.

24. A lighting device of claim 23, wherein the light emission of at least two light emitting diodes are of different wavelengths to each other such that the colour of the light emission of the lighting device is adjustable in accordance with the first control signal.

25. A lighting assembly comprising:

a plurality of substrates maintained in a spaced apart relationship to allow airflow therebetween and further in thermal communication with each other to provide thermal distribution between the substrates, each substrate carrying thereon at least one light emission source, wherein a first substrate is located towards a proximal end of the device and a second substrate is located towards a distal end of the device;

a signal transceiver for receiving a first control signal from a remote control device and for transmitting a second control signal to a further light assembly; said signal transceiver being located proximal of the first substrate; and a controller in communication with said signal transceiver and the light emission source, and for controlling at least one characteristic of the light emission sources on the plurality of substrates in response to said first control signal and for generating the second control signal.

26. A lighting assembly according claim 25, wherein each substrate includes at least one rebate or aperture located in a position so as to allow light generated from the light emission source on one distally adjacent substrate to pass therethrough in a proximal direction.

27. The lighting assembly according to claim 25, wherein each of the light emitting sources has a unique light emitting source address code, and wherein the first control signal includes at least one identifying address code identifying one of the light emitting sources and one control code such that said one of the light emitting sources is individually selectable by the remote controller for further operation in accordance with the control code.

28. The lighting assembly according to claim 25, wherein the controller controls activation, deactivation, or adjusts the brightness of the light emitting source in accordance with the first control signal.

29. The lighting assembly according to claim 25, wherein the light emitting sources are light emitting diodes.

30. The lighting assembly according to claim 29, wherein the light emission of the light emitting diodes are of different wavelengths to each other such that the colour of the light emission of the lighting assembly is adjustable in accordance with the first control signal.

31. A lighting assembly according to claim 25, wherein the plurality of substrates are substantially planar and substantially parallel to each other.

32. The lighting assembly according to claim 31, wherein the plurality of substrates are axially aligned and progressively distally smaller in size.

33. The lighting assembly according to claim 31, wherein the light emission sources are progressively located radially inwardly respectively of those of a proximally adjacent substrate.

34. The lighting assembly according to claim 33, wherein the substrates are generally circular in shape.

35. The lighting assembly according to claim 33 wherein the substrates are generally annular in shape.

36. The lighting assembly according to claim 33, wherein the light emission sources carried by one of the plurality of substrates are radially and/or circumferentially offset from those carried by other substrates.

* * * * *